(12) United States Patent
Sato et al.

(10) Patent No.: US 7,574,633 B2
(45) Date of Patent: Aug. 11, 2009

(54) TEST APPARATUS, ADJUSTMENT METHOD AND RECORDING MEDIUM

(75) Inventors: Naoki Sato, Tokyo (JP); Noriaki Chiba, Tokyo (JP); Tomohiro Uematsu, Tokyo (JP)

(73) Assignee: Advantest Corporation, Tokyo (JP)

( * ) Notice: Subject to any disclaimer, the term of this patent is extended or adjusted under 35 U.S.C. 154(b) by 315 days.

(21) Appl. No.: 11/643,010

(22) Filed: Dec. 20, 2006

(65) Prior Publication Data

US 2008/0012576 A1    Jan. 17, 2008

(30) Foreign Application Priority Data

Jul. 12, 2006    (JP) .............................. 2006-191140

(51) Int. Cl.
*G06K 5/04* (2006.01)

(52) U.S. Cl. ................ 714/700; 702/108; 702/124; 702/125; 365/201; 714/25; 714/707; 714/709; 714/715; 714/718; 714/719; 714/724; 714/731; 714/735; 714/738; 714/744

(58) Field of Classification Search .................. None
See application file for complete search history.

(56) References Cited

U.S. PATENT DOCUMENTS 7,307,895 B2 * 12/2007 Kuhn et al. ............. 365/189.07
2001/0052097 A1 * 12/2001 Miura ......................... 714/744
2004/0122620 A1 * 6/2004 Doi et al. .................... 702/182
2005/0149801 A1 * 7/2005 Oshima ....................... 714/731

FOREIGN PATENT DOCUMENTS

JP    2001-201532 A    7/2001
JP    2002-042498 A    2/2002
JP    2005-285160 A    10/2005

OTHER PUBLICATIONS

International Search Report issued in International Application No. PCT/JP2007/063654 mailed on Sep. 18, 2007, 10 pages.

* cited by examiner

*Primary Examiner*—John P Trimmings
(74) *Attorney, Agent, or Firm*—Osha • Liang LLP

(57) ABSTRACT

There is provided a test apparatus that tests a device under test including a plurality of data terminals and a clock output terminal, the test apparatus including a plurality of first variable delay circuits that delays a reference clock, a plurality of timing clock generating sections that outputs a timing clock having a phase obtained by shifting a phase of the delayed reference clock by a designated phase shift amount, a timing comparator that acquires a data signal in accordance with the timing clock, a plurality of second variable delay circuits that delays the timing clock, a plurality of phase comparators that outputs a phase shift amount according to a phase difference between a clock signal and the timing clock, a first adjusting section that adjusts a delay amount of the first variable delay circuit so that the timing comparator acquires a data signal based on the timing clock, and a second adjusting section that adjusts a delay amount of the second variable delay circuit so that the timing comparator acquires the data signal based on the clock signal.

11 Claims, 9 Drawing Sheets

TEST APPARATUS, ADJUSTMENT METHOD AND RECORDING MEDIUM

CROSS REFERENCE TO RELATED APPLICATION

The present application claims priority from a Japanese Patent Application No. 2006-191140 filed on Jul. 12, 2006, the contents of which are incorporated herein by reference.

BACKGROUND

1. Technical Field

The present invention relates to a test apparatus, an adjustment method, and a recording medium. More particularly, the present invention relates to a test apparatus that tests a device under test including a plurality of data terminals and a clock output terminal for outputting a clock signal showing the timing at which data signals output from the plurality of data terminals should be acquired, and an adjustment method and a recording medium therefor.

2. Related Art

There is known a device (a source synchronous device) including a plurality of data terminals and a clock output terminal for outputting a clock signal showing the timing at which data signals output from the plurality of data terminals should be acquired. A test apparatus that tests a device under test having a high-speed serial interface operating in a clock embedding method is known as disclosed, for example, in Japanese Patent Application Publication No. 2005-285160.

Meanwhile, according to a conventional test apparatus, since a delay amount of a transmission route of a data signal and a delay amount of a transmission route of a clock signal are different between pins, it has been difficult to simultaneously acquire a plurality of data signals using a clock signal output from a source synchronous device as a standard and test the plurality of data signals in parallel.

SUMMARY

Therefore, it is an object of some aspects of the present invention to provide a test apparatus, an adjustment method, and a recording medium that can solve the foregoing problems. The above and other objects can be achieved by combinations described in the independent claims. The dependent claims define further advantageous and exemplary combinations of the present invention.

To solve the above problem, according to the first aspect of the present invention, there is provided a test apparatus that tests a device under test including a plurality of data terminals and a clock output terminal for outputting a clock signal showing the timing at which data signals output from the plurality of data terminals should be acquired. The test apparatus includes: a reference clock source that generates a reference clock for this test apparatus; a plurality of first variable delay circuits that is provided corresponding to the plurality of data terminals and each of which delays the reference clock by a designated time; a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount; a timing comparator that is provided corresponding to the plurality of data terminals and each of which acquires a data signal output from the corresponding data terminal in accordance with the corresponding timing clock; a plurality of second variable delay circuits that is provided corresponding to the plurality of data terminals and each of which delays the corresponding timing clock by a designated time; a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference; a first adjusting section that adjusts a delay amount of each of the plurality of first variable delay circuits so that the plurality of timing comparators acquires data signals simultaneously output from the plurality of data terminals based on the plurality of timing clocks output from the plurality of timing clock generating sections; and a second adjusting section that adjusts a delay amount of each of the plurality of second variable delay circuits, so that the plurality of timing comparators can acquire the data signals simultaneously output from the plurality of data terminals based on the clock signal output from the clock output terminal, in the state that the first adjusting section has adjusted the delay amount of each of the plurality of first variable delay circuits.

The test apparatus may further include a plurality of test signal supplying sections that is provided corresponding to the plurality of data terminals and each of which outputs a test signal to be supplied to the corresponding data terminal, and the first adjusting section may include: a first adjustment processing section that inputs the plurality of test signals output from the plurality of test signal supplying sections, in place of the plurality of data signals output from the plurality of data terminals, into the plurality of timing comparators and adjusts an acquisition timing of each timing comparator so that the plurality of timing comparators can acquire the plurality of test signals simultaneously output from the plurality of test signal supplying sections based on the plurality of timing clocks, in a state that the phase shift amount for each of the plurality of timing clock generating sections has been set to a predetermined reference value; a second adjustment processing section that inputs the plurality of test signals, in place of the clock signal, into the plurality of phase comparators and makes the plurality of phase comparators determine the phase shift amount for each of the plurality of timing clock generating sections; and a first delay amount setting section that sets, for each of the plurality of second variable delay circuits, a delay amount by which a differential value between the phase shift amount determined by the second adjustment processing section and the reference value substantially becomes zero.

The first adjusting section may further include: a third adjustment processing section that makes the plurality of phase comparators receive the plurality of data signals output from the plurality of data terminals of the device under test in place of the clock signal and makes the plurality of phase comparators determine the phase shift amount of each of the plurality of timing clock generating sections, in the state that the first delay amount setting section has set a delay amount of the plurality of second variable delay circuits; and a second delay amount setting section that sets, for each of the plurality of first variable delay circuits, a delay amount by which a differential value between the phase shift amount determined by the third adjustment processing section and the reference value substantially becomes zero.

The second adjusting section may include: a fourth adjustment processing section that makes the plurality of phase comparators receive the clock signal and makes the plurality of phase comparators determine the phase shift amount of each of the plurality of timing clock generating sections, in the state that the first delay amount setting section has set the delay amount of the plurality of second variable delay circuits and the second delay amount setting section has set the delay amount of the plurality of first variable delay circuits; and a third delay amount setting section that sets, for each of the plurality of second variable delay circuits, a delay amount by which a differential value between the phase shift amount determined by the fourth adjustment processing section and the reference value substantially becomes zero.

The device under test may be a device having a memory, the test signal supplying section may write data for adjustment into the memory in advance of the adjustment by the third adjustment processing section, and the third adjustment processing section may read the data for adjustment from the memory, input the plurality of data signals included in the read data for adjustment into the plurality of phase comparators, and make the plurality of phase comparators determine the phase shift amount of each of the plurality of timing clock generating sections.

The test apparatus may further include a pattern generator that executes a test sequence designated by a user and supplies a test pattern associated with this test sequence to the plurality of test signal supplying sections, each of the plurality of test signal supplying sections may output a test signal based on the test pattern supplied from the pattern generator to the corresponding data terminal of the device under test, and the pattern generator may cause at least one of a set of the third adjustment processing section and the second delay amount setting section and a set of the fourth adjustment processing section and the third delay amount setting section to start phase adjustment, when the phase adjustment has been started by an instruction in the test sequence during executing the test sequence.

The test apparatus may further include a plurality of deciding sections that compares each of the plurality of data signals acquired by the plurality of timing comparators with an expected value to decide the good or bad of each data signal, and the pattern generator may prohibit the quality decision for the plurality of data signals performed by the plurality of deciding sections while at least one of a set of the third adjustment processing section and the second delay amount setting section and a set of the fourth adjustment processing section and the third delay amount setting section performs the phase adjustment.

The test apparatus may further include: a pattern generator that executes a test sequence included in a designated test program and supplies a test pattern associated with this test sequence to the plurality of test signal supplying sections; and a control apparatus that executes a test control program designated by a user and makes the pattern generator sequentially execute a plurality of test programs described in the test control program, each of the plurality of test signal supplying sections may output a test signal based on the test pattern supplied from the pattern generator to the corresponding data terminal of the device under test, and the control apparatus may cause at least one of a set of the third adjustment processing section and the second delay amount setting section and a set of the fourth adjustment processing section and the third delay amount setting section to start phase adjustment, when a start command of phase adjustment is executed between the end of execution of the one test program and the start of execution of the other test program during executing the test control program.

The test apparatus may further include a plurality of detecting sections that is provided corresponding to the plurality of phase comparators and detects whether the phase shift amount output from the corresponding phase comparator during executing the test program becomes a value outside a predetermined acceptable limit, and the control apparatus may cause a set of the fourth adjustment processing section and the third delay amount setting section to start phase adjustment, on condition that either of the detecting sections has detected that the phase shift amount become a value outside an acceptable limit, when the command is executed during executing the test control program.

According to the second aspect of the present invention, there is provided an adjustment method for adjusting a test apparatus that tests a device under test including a plurality of data terminals and a clock output terminal for outputting a clock signal showing the timing at which data signals output from the plurality of data terminals should be acquired. The test apparatus includes: a reference clock source that generates a reference clock for this test apparatus; a plurality of first variable delay circuits that is provided corresponding to the plurality of data terminals and each of which delays the reference clock by a designated time; a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount; a timing comparator that is provided corresponding to the plurality of data terminals and each of which acquires a data signal output from the corresponding data terminal in accordance with the corresponding timing clock; a plurality of second variable delay circuits that is provided corresponding to the plurality of data terminals and each of which delays the corresponding timing clock by a designated time; and a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference, and the adjustment method includes: a first adjusting step of adjusting a delay amount of each of the plurality of first variable delay circuits so that the plurality of timing comparators acquires data signals simultaneously output from the plurality of data terminals based on the plurality of timing clocks output from the plurality of timing clock generating sections; and a second adjusting step of adjusting a delay amount of each of the plurality of second variable delay circuits, so that the plurality of timing comparators can acquire the data signals simultaneously output from the plurality of data terminals based on the clock signal output from the clock output terminal, in the state that the delay amount of each of the plurality of first variable delay circuits has been adjusted in the first adjusting step.

According to the third aspect of the present invention, there is provided a recording medium for recording an adjustment program being executed in a test apparatus that tests a device under test including a plurality of data terminals and a clock output terminal for outputting a clock signal showing the timing at which data signals output from the plurality of data terminals should be acquired. The test apparatus includes: a reference clock source that generates a reference clock for this test apparatus; a plurality of first variable delay circuits that is provided corresponding to the plurality of data terminals and each of which delays the reference clock by a designated time; a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount; a timing comparator that is provided corresponding to the plurality of data terminals and each of which acquires a data signal output from the corresponding data terminal in accordance with the corresponding timing clock; a plurality of second variable delay circuits that is provided corresponding to the plurality of data terminals and each of which delays the corresponding timing clock by a designated time; and a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference, and the adjustment program makes the test apparatus function as: a first adjusting section that adjusts a delay amount of each of the plurality of first variable delay circuits so that the plurality of timing comparators acquires data signals simultaneously output from the plurality of data terminals based on the plurality of timing clocks output from the plurality of timing clock generating sections; and a second adjusting section that adjusts a delay amount of each of the plurality of second variable delay circuits, so that the plurality of timing comparators can acquire the data signals simultaneously output from the plurality of data terminals based on the clock signal output from the clock output terminal, in the state that the first adjusting section has adjusted the delay amount of each of the plurality of first variable delay circuits.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
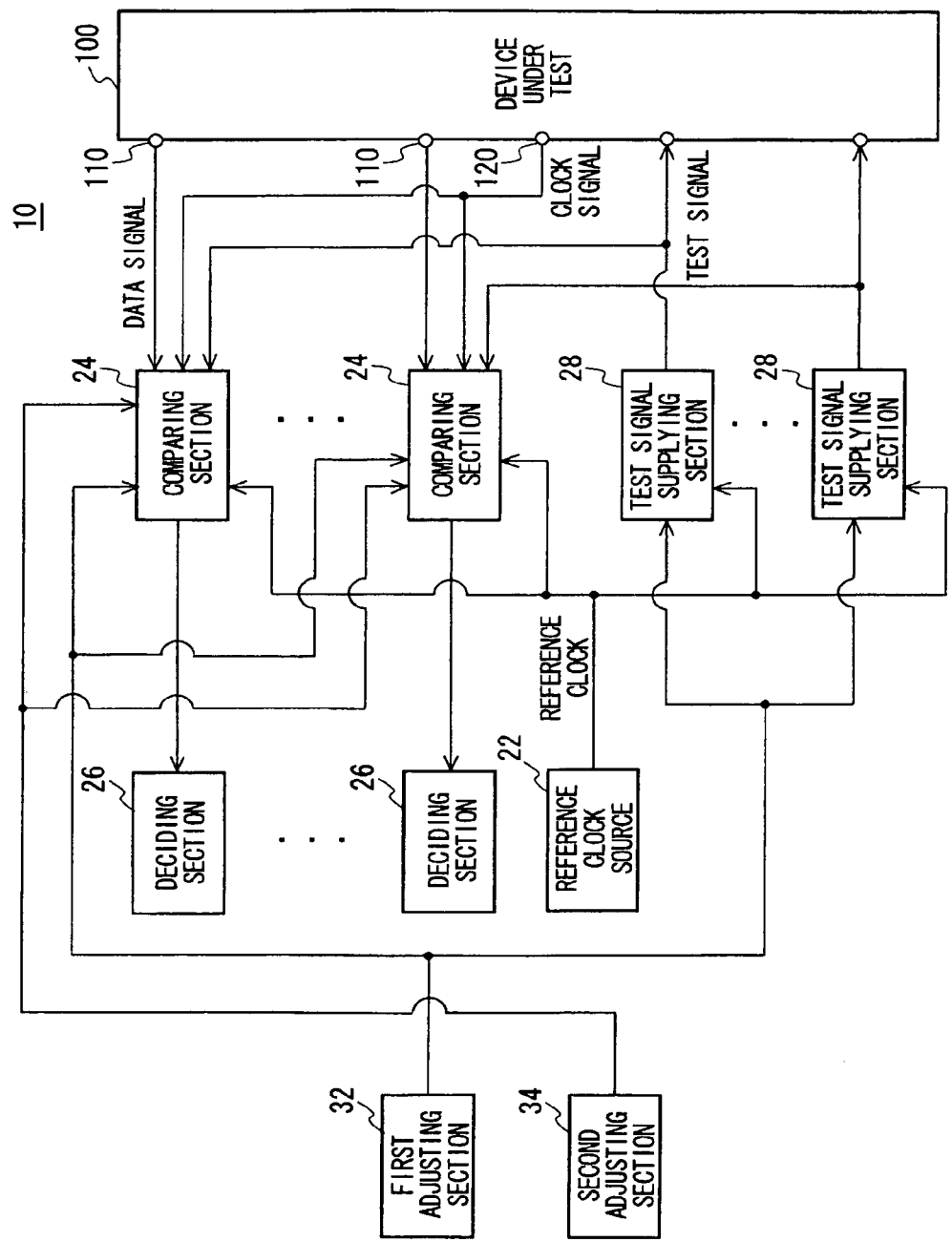
FIG. 1 is a view showing a configuration of a test apparatus 10 according to the present embodiment along with a device under test 100.

FIG. 1 is a view showing a configuration of a test apparatus 10 according to the present embodiment along with a device under test 100. The test apparatus 10 tests the device under test 100 including a plurality of data terminals 110 and a clock output terminal 120 for outputting a clock signal showing the timing at which data signals output from the plurality of data terminals 110 should be acquired. As an example, the device under test 100 may be a device having a memory that transmits data in a source synchronous method. The test apparatus 10 concurrently acquires a plurality of data signals output from the plurality of data terminals 110 according to the timing based on the clock signal output from the clock output terminal 120. Then, the test apparatus 10 decides the quality of the plurality of concurrently acquired data signals. Furthermore, the test apparatus 10 executes a calibration process so that the apparatus can concurrently acquire the plurality of data signals simultaneously output from the plurality of data terminals 110 based on the clock signal output from the clock output terminal 120, before testing the device under test 100 or during executing a test sequence.

The test apparatus 10 includes a reference clock source 22, a plurality of comparing sections 24, a plurality of deciding sections 26, a plurality of test signal supplying sections 28, a first adjusting section 32, and a second adjusting section 34. The reference clock source 22 generates a reference clock for this test apparatus 10. The plurality of comparing sections 24 are respectively provided corresponding to the plurality of data terminals 110, and respectively acquire the data signals output from the corresponding data terminals 110 at the timing based on the clock signal output from the clock output terminal 120.

The plurality of deciding sections 26 are respectively provided corresponding to the plurality of data terminals 110, and compare each of the plurality of data signals acquired by the corresponding comparing sections 24 with an expected value to decide the good or bad of each data signal. The plurality of test signal supplying sections 28 are respectively provided corresponding to the plurality of data terminals 110, and respectively output test signals to be supplied to the corresponding data terminals 110 in synchronization with a reference clock output from the reference clock source 22. The first adjusting section 32 and the second adjusting section 34 control the test apparatus 10 to calibrate the plurality of comparing sections 24 before testing the device under test 100 or during executing a test sequence.

Figure 2:
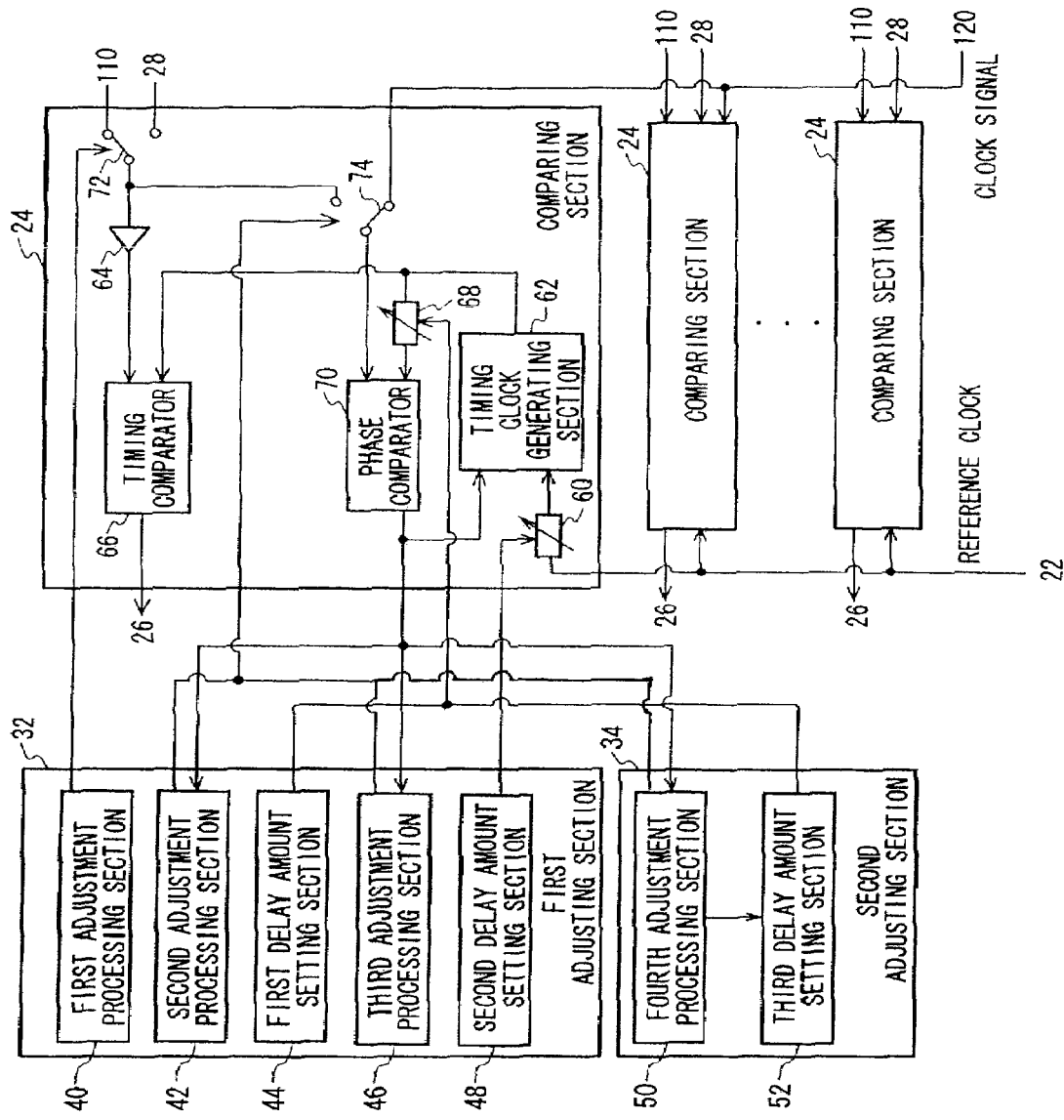
FIG. 2 is a view exemplary showing a configuration of a comparing section 24, a first adjusting section 32, and a second adjusting section 34 according to the present embodiment.

FIG. 2 is a view showing a configuration of the comparing section 24, the first adjusting section 32, and the second adjusting section 34 according to the present embodiment. First, in the first step, the test apparatus 10 adjusts an acquisition timing so that the comparing section can concurrently acquire a plurality of test signals simultaneously output from the plurality of test signal supplying sections 28 according to the timing of the reference clock. Next, in the second step, the test apparatus 10 adjusts an acquisition timing so that the comparing section can concurrently acquire the plurality of simultaneously output test signals according to the timings of the plurality of test signals. Next, in the third step, the test apparatus 10 adjusts an acquisition timing so that the comparing section can concurrently acquire the plurality of simultaneously output data signals according to the timings of the plurality of data signals output from the plurality of data terminals 110 of the device under test 100. Next, in the fourth step, the test apparatus 10 adjusts an acquisition timing so that the comparing section can concurrently acquire the plurality of data signals simultaneously output from the plurality of data terminals 110 of the device under test 100 according to the timing of the clock signal output from the clock output terminal 120 of the device under test 100.

In order to perform operations of the first step to the fourth step as described above, the test apparatus 10 includes a plurality of first variable delay circuits 60, a plurality of timing clock generating sections 62, a plurality of level comparators 64, a plurality of timing comparators 66, a plurality of second variable delay circuits 68, a plurality of phase comparators 70, a plurality of first switches 72, and a plurality of second switches 74, which are respectively provided corresponding to the plurality of data terminals 110. Here, each of the plurality of comparing sections 24 has the first variable delay circuit 60, the timing clock generating section 62, the level comparator 64, the timing comparator 66, the second variable delay circuit 68, the phase comparator 70, the first switch 72, and the second switch 74, which correspond to the corresponding data terminal 110.

Each of the plurality of first variable delay circuits 60 delays the reference clock by a designated time. Each of the plurality of timing clock generating sections 62 outputs a timing clock having a phase obtained by shifting a phase of the reference clock delayed by the corresponding first variable delay circuit 60 by a phase shift amount designated by the phase comparator 70. As an example, each of the plurality of timing clock generating sections 62 may be a PLL (Phase Locked Loop) circuit for generating a timing clock with frequency of an integral multiple of the reference clock. In this case, each of the plurality of timing clock generating sections 62 applies an offset voltage from the phase comparator 70 to control volume of the PLL in order to generate a timing clock having a phase shifted by a phase shift amount from the reference clock.

The plurality of level comparators 64 respectively binarizes the data signals output from the corresponding data terminals 110 at a predetermined threshold level. Each of the plurality of timing comparators 66 acquires a data signal output from the corresponding data terminal 110 in accordance with a timing clock output from the corresponding timing clock generating section 62 via the corresponding level comparator 64. As an example, each of the plurality of timing comparators 66 acquires an output signal from the corresponding level comparator 64 at the timing (for example, a rising edge or a falling edge) of the corresponding timing clock.

Each of the plurality of second variable delay circuits 68 delays a timing clock output from the corresponding timing clock generating section 62 by a designated time. Each of the plurality of phase comparators 70 detects a phase difference between the clock signal output from the clock output terminal 120 and the timing clock delayed by the corresponding second variable delay circuit 68, and outputs a phase shift amount according to this phase difference. In this way, the timing clock generating section 62 inputting the phase shift amount output from the phase comparator 70 can output a timing clock obtained by advancing the clock signal by the delay amount by the second variable delay circuit 68.

Each of the plurality of first switches 72 selectively inputs the data signal output from the corresponding data terminal 110 or the test signal output from the corresponding test signal supplying section 28 into the corresponding timing comparator 66. Each of the plurality of first switches 72 inputs the data signal output from the corresponding data terminal 110 into the corresponding timing comparator 66 during testing the device under test, and inputs the test signal output from the corresponding test signal supplying section 28, in place of the data signal output from the corresponding data terminal 110, into the corresponding timing comparator 66 when switching for calibration is set. In addition, when executing a calibration process in the middle of a test sequence, each of the plurality of first switches 72 may input the data signal output from the corresponding data terminal 110 into the corresponding timing comparator 66 and then perform a calibration process.

In addition, when inputting a test signal into the timing comparator 66 in place of a data signal, the test apparatus 10 may provide a substrate, on which a plurality of short wires for transmitting each of the plurality of test signals output from the plurality of test signal supplying sections 28 to the corresponding timing comparator 66 is formed, in place of a substrate on which the device under test 100 is mounted.

Each of the plurality of second switches 74 selectively inputs, into the corresponding phase comparator 70, the clock signal output from the corresponding clock output terminal 120, or the data signal output from the corresponding data terminal 110 or the test signal output from the corresponding test signal supplying section 28. Each of the plurality of second switches 74 inputs the clock signal output from the corresponding clock output terminal 120 into the corresponding phase comparator 70 during testing the device under test, and inputs the data signal output from the corresponding data terminal 110 or the test signal output from the corresponding test signal supplying section 28 into the corresponding phase comparator 70, in place of the clock signal output from the corresponding clock output terminal 120, when switching for calibration is set.

The first adjusting section 32 for calibrating the comparing section 24 with such a configuration adjusts a delay amount of each of the plurality of first variable delay circuits 60, so that the plurality of timing comparators 66 acquires the data signals simultaneously output from the plurality of data terminals 110 based on the plurality of timing clocks output from the plurality of timing clock generating sections 62. In the present embodiment, the first adjusting section 32 has a first adjustment processing section 40, a second adjustment processing section 42, a first delay amount setting section 44, a third adjustment processing section 46, and a second delay amount setting section 48.

The first adjustment processing section 40 adjusts an acquisition timing of each of the plurality of timing comparators 66, so that the plurality of timing comparators 66 can simultaneously acquire the plurality of test signals simultaneously output from the plurality of test signal supplying sections 28. The second adjustment processing section 42 makes each of the plurality of phase comparators 70 determine a phase shift amount, with the aim of removing a difference between a path from the test signal supplying section 28 to the timing comparator 66 and a path from the test signal supplying section 28 to the phase comparator 70. The first delay amount setting section 44 sets a delay amount of each of the plurality of second variable delay circuits 68, with the aim of delaying a timing clock by a delay amount on a path between a data input port of the test apparatus 10 and the phase comparator 70.

The third adjustment processing section 46 makes each of the plurality of phase comparators 70 determine a phase shift amount, with the aim of detecting a delay amount on a path between the data terminal 110 and the data input port of the test apparatus 10. The second delay amount setting section 48 sets a delay amount of each of the plurality of first variable delay circuits 60, with the aim of delaying the reference clock by a delay amount on the path between the data terminal 110 and the data input port of the test apparatus 110.

Moreover, the second adjusting section 34 for calibrating the comparing section 24 with such a configuration adjusts a delay amount of each of the plurality of second variable delay circuits 68, so that the plurality of timing comparators 66 can acquire the data signals simultaneously output from the plurality of data terminals 110 based on the clock signal output from the clock output terminal 120, in a state that the first adjusting section 32 has adjusted the delay amount of each of the plurality of first variable delay circuits 60. In the present embodiment, the second adjusting section 34 has a fourth adjustment processing section 50 and a third delay amount setting section 52.

The fourth adjustment processing section 50 makes each of the plurality of phase comparators 70 determine a phase shift amount, with the aim of detecting a delay amount on a path between the clock output terminal 120 and the corresponding phase comparator 70. The third delay amount setting section 52 sets a delay amount of each of the plurality of second variable delay circuits 68, with the aim of delaying a timing clock by the delay amount on the path between the clock output terminal 120 and the corresponding phase comparator 70.

Figure 3:
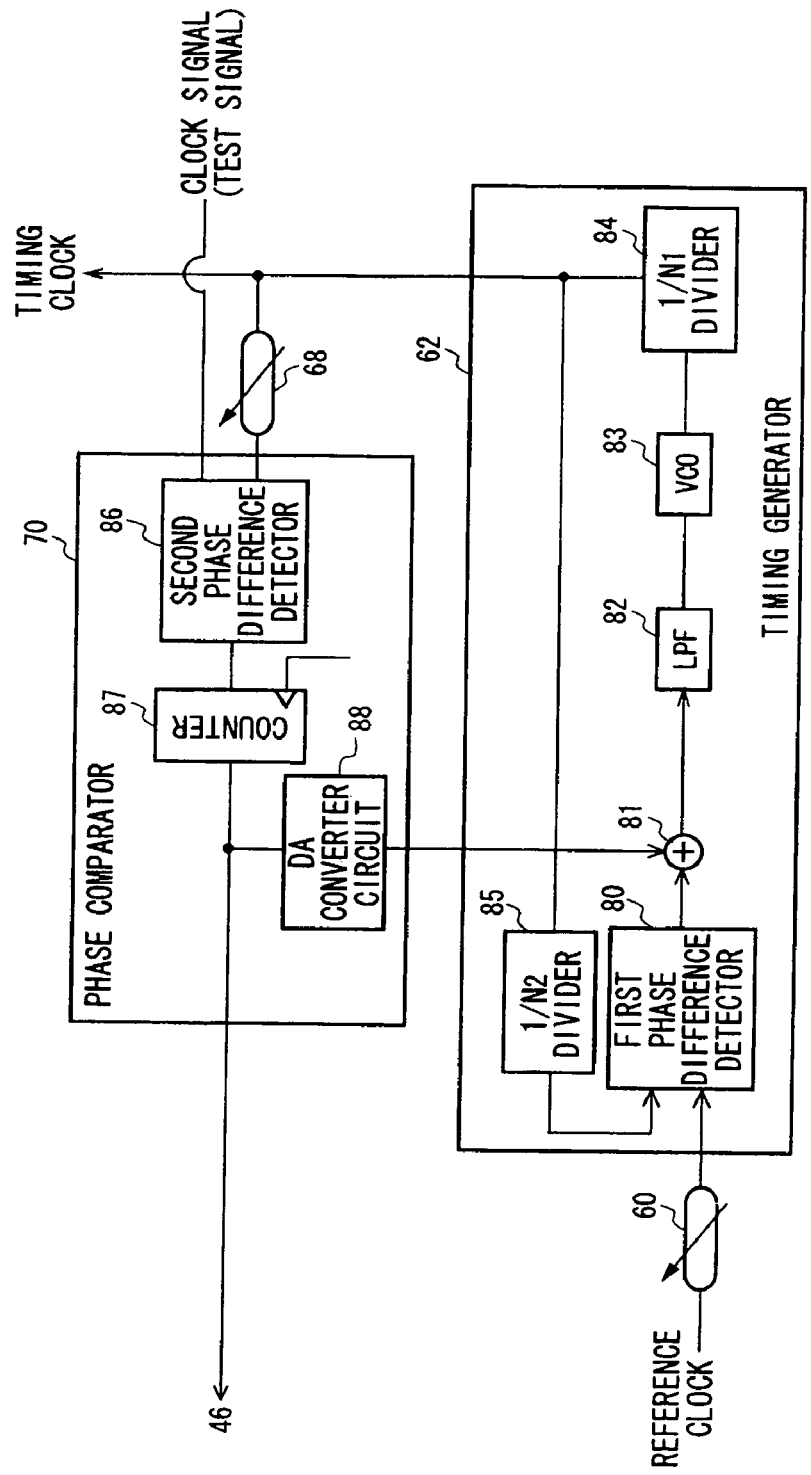
FIG. 3 is a view exemplary showing a configuration of a timing clock generating section 62 and a phase comparator 70 along with a first variable delay circuit 60 and a second variable delay circuit 68.

FIG. 3 is a view exemplary showing a configuration of the timing clock generating section 62 and the phase comparator 70 along with the first variable delay circuit 60 and the second variable delay circuit 68. As an example, the timing clock generating section 62 may be a PLL circuit for generating a timing clock with frequency of an integral multiple of the reference clock. The timing clock generating section 62 constituting a PLL circuit may exemplary have a first phase difference detector 80, an adder 81, an LPF 82, a VCO 83, an 1/N1 divider 84, and an 1/N2 divider 85.

The first phase difference detector 80 detects a phase difference between the reference clock delayed by the first variable delay circuit 60 and a signal output from the 1/N2 divider 85, and outputs a signal having duty according to the detected phase difference. The adder 81 adds a voltage output from the phase comparator 70 to a voltage of the output signal from the first phase difference detector 80. The LPF 82 outputs a control voltage obtained by smoothing the voltage output from the adder 81. The VCO 83 outputs a signal with frequency according to the control voltage output from the LPF 82. The 1/N1 divider 84 divides frequency of the signal output from the VCO 83 by 1/N1 (N1 is an integer number).

The 1/N2 divider 85 divides frequency of the signal output from the 1/N1 divider 84 by 1/N2 (N2 is an integer number). The timing clock generating section 62 with such a configuration outputs the signal output from the 1/N1 divider 84 as a timing clock. The timing clock generating section 62 can output a timing clock with frequency obtained by multiplying the frequency of reference clock by N2, in which the timing clock is shifted by a phase according to the voltage value output from the phase comparator 70 from the reference clock delayed by the first variable delay circuit 60.

Moreover, as an example, the phase comparator 70 may have a second phase difference detector 86, a counter 87, and a DA converter circuit 88. The second phase difference detector 86 detects a phase difference between a timing clock delayed by the second variable delay circuit 68 and a clock signal (or a test signal or a data signal), and outputs a signal having duty according to the detected phase difference.

The counter 87 performs an up counting operation or a down counting operation in accordance with the output signal from the second phase difference detector 86. As an example, the counter 87 performs an up counting operation in case that the output signal from the second phase difference detector 86 is a high-level signal and performs a down counting operation in case that the output signal from the second phase difference detector 86 is a low-level signal. According to this, the counter 87 can output a digital value according to the phase difference between the timing clock delayed by the second variable delay circuit 68 and the clock signal (or the test signal or the data signal). The DA converter circuit 88 outputs a voltage with a value according to a count value by the counter 87.

Such the phase comparator 70 can output a timing clock having a phase delayed from the reference clock by the phase difference between the timing clock delayed by the second variable delay circuit 68 and the clock signal (or the test signal or the data signal). Furthermore, such the phase comparator 70 can output a value of the counter 87 as a phase shift amount according to the phase difference between the timing clock delayed by the second variable delay circuit 68 and the clock signal (or the test signal or the data signal).

Figure 4:
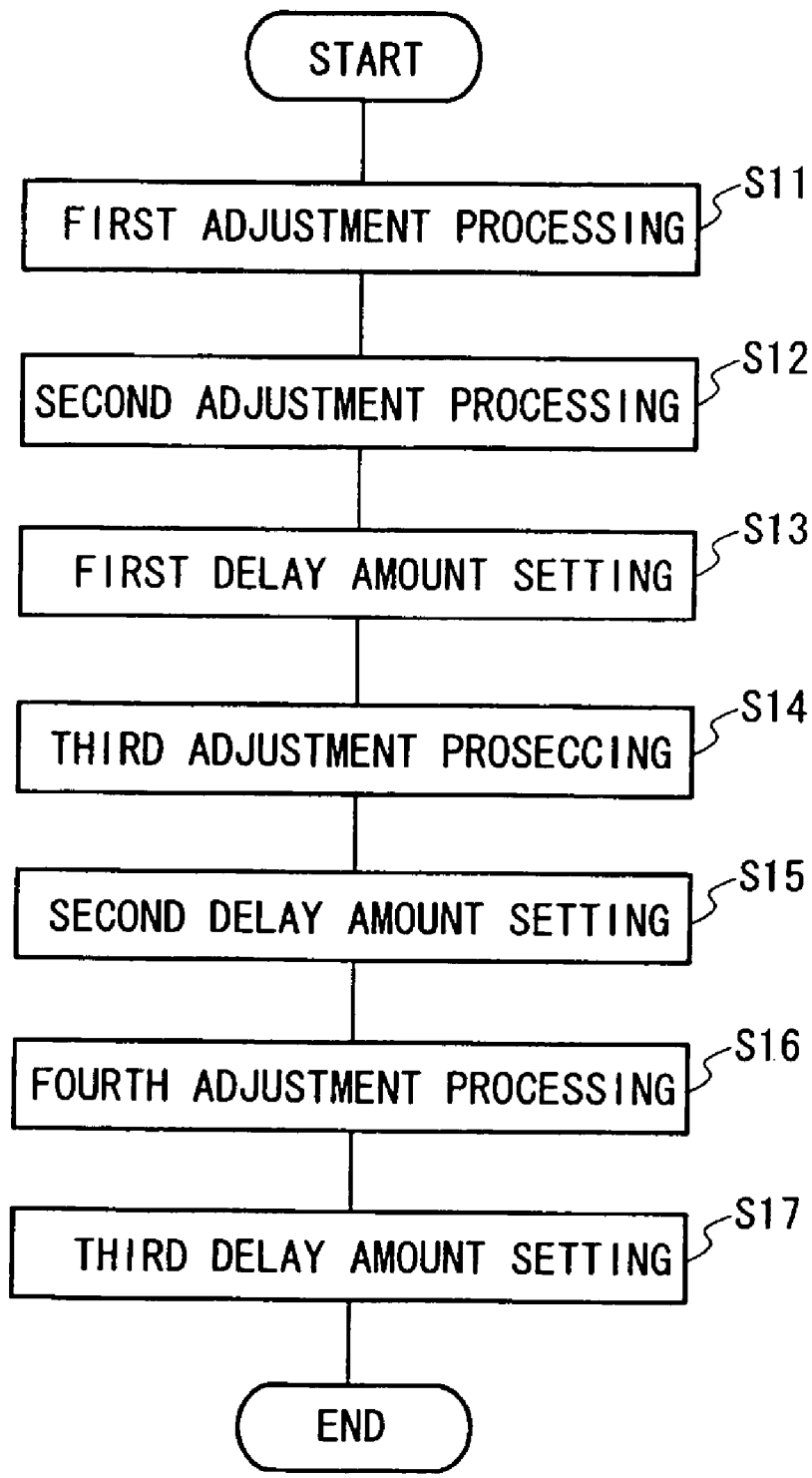
FIG. 4 is a view showing calibration processing procedures for a test apparatus 10.

FIG. 4 is a view showing calibration processing procedures for the test apparatus 10. First, the first adjustment processing section 40 is operable to set a phase shift amount of each of the plurality of timing clock generating sections 62 as a predetermined reference value (for example, zero). Subsequently, the first adjustment processing section 40 makes the plurality of timing comparators 66 receive the plurality of test signals output from the plurality of test signal supplying sections 28 in place of the plurality of data signals output from the plurality of data terminals 10 by means of switching the first switch 72. In this case, the test apparatus 10 may mount thereon a substrate on which a plurality of short wires is formed, in which the wires transmit the plurality of test signals output from the plurality of test signal supplying sections 28 to the corresponding timing comparators 66, in place of the device under test 100 in place of switching by the first switch 72. Subsequently, the first adjustment processing section 40 adjusts an acquisition timing of each timing comparator 66 so that the plurality of timing comparators 66 can acquire the plurality of test signals simultaneously output from the plurality of test signal supplying sections 28 based on the plurality of timing clocks (S11).

As an example, the first adjustment processing section 40 may delay a timing signal to be input into this timing comparator 66 so that the plurality of timing comparators 66 can acquire the plurality of test signals simultaneously output as the same timing signal. More specifically, each of the comparing sections 24 further has a delay circuit between a connecting point between an input port of the second variable delay circuit 68 and an output port of the timing clock generating section 62 and the timing comparator 66, and the first adjustment processing section 40 may adjust a delay amount of this delay circuit. By performing a process of step S11, the test apparatus 10 adjusts the timing so that the timing generator can concurrently acquire the plurality of test signals simultaneously output from the plurality of test signal supplying sections 28 by means of the timing of reference clock.

Next, the second adjustment processing section 42 inputs the plurality of test signals into the plurality of phase comparators 70 in place of the clock signal by means of switching the second switch 74. Subsequently, the second adjustment processing section 42 makes the plurality of phase comparators 70 determine a phase shift amount of each of the plurality of timing clock generating sections 62 (S12). In case that the timing clock generating section 62 has a PLL circuit, the second adjustment processing section 42 may acquire the phase shift amount after the PLL circuit becomes stable. More specifically, the second adjustment processing section 42 may acquire the phase shift amount after phase jitter fluctuation of the timing clock becomes smaller than a predetermined value or after a predetermined time passes.

According to this, the second adjustment processing section 42 can compute a delay amount on a path between the corresponding data input port (for example, the input port of the first switch 72) in the test apparatus 10 and the corresponding timing comparator 66 for acquiring this data signal based on an amount changed from a reference value of the phase shift amount determined by each of the plurality of phase comparators 70.

Next, the first delay amount setting section 44 substantially sets a delay amount, by which a differential value between the phase shift amount determined by the second adjustment processing section 42 and the reference value becomes zero, for each of the plurality of second variable delay circuits 68 (S13). In other words, the first delay amount setting section 44 sets a delay amount by which a phase shift amount becomes zero for each of the plurality of second variable delay circuits 68, when performing a process of step S12 in the state that the timing clock has been previously delayed by the second variable delay circuit 68 and been input into the phase comparator 70. As a result, each of the plurality of second variable delay circuits 68 inputs a timing clock, which is delayed by the delay amount on the path between the corresponding data input port and the corresponding timing comparator 66 in the test apparatus 10, into the phase comparator 70. By means of performing processes of step S12 and S13, the test apparatus 10 adjusts the timing so that the plurality of test signals simultaneously output according to the timing of the plurality of test signals can be concurrently acquired.

Next, the third adjustment processing section 46 is operable to make the state where a delay amount of the plurality of second variable delay circuits 68 has been set by the first delay amount setting section 44. Subsequently, the third adjustment processing section 46 inputs the plurality of data signals output from the plurality of data terminals 110 in the device under test 100 into the plurality of phase comparators 70 in place of the clock signal by means of switching the second switch 74. Subsequently, the third adjustment processing section 46 makes the plurality of phase comparators 70 determine the phase shift amount of each of the plurality of timing clock generating sections 62 (S14). In case that the timing clock generating section 62 has a PLL circuit, the third adjustment processing section 46 may acquire a phase shift amount after this PLL circuit becomes stable. More specifically, the third adjustment processing section 46 may acquire the phase shift amount after phase jitter fluctuation of the timing clock becomes smaller than a predetermined value or after a predetermined time passes.

Here, since the delay amount of the plurality of second variable delay circuits 68 has been set by the first delay amount setting section 44, the phase shift amount has a value according to a delay amount on a path excepting the path between the data input port and the timing comparator 66. Therefore, the third adjustment processing section 46 can compute a delay amount on a path between the corresponding data terminal 110 in the device under test 100 and the corresponding data input port in the test apparatus 10, based on an amount by which the phase shift amount determined by each of the plurality of phase comparators 70 is changed from a reference value.

Next, the second delay amount setting section 48 sets a delay amount, by which a differential value between the phase shift amount determined by the third adjustment processing section 46 and the reference value substantially becomes zero, for each of the plurality of first variable delay circuits 60 (S15). Hereby, each of the first variable delay circuits 60 can input a reference clock, which is delayed by the delay amount on the path between the corresponding data terminal 110 in the device under test 100 and the corresponding data input port in the test apparatus 10, into the timing clock generating section 62. By means of performing processes of steps S14 and S15, the test apparatus 10 adjusts the timing so that the plurality of data signals simultaneously output according to the timing of the plurality of data signals output from the plurality of data terminals 110 can be concurrently acquired.

By means of performing processes from step S11 to step S15 as described above, the timing clock generating section 62 can output a timing clock delayed by a delay amount on the entire path from the data terminal 110 of the device under test 100 to the timing comparator 66. According to this, each of the plurality of timing comparators 66 is adjusted so that each can acquire the data signal output from the corresponding data terminal 110 at the timing of the timing clock generated on the basis of the reference clock.

Next, the fourth adjustment processing section 50 is operable to set a delay amount of the plurality of second variable delay circuits 68 to a predetermined value (for example, zero) and to set a delay amount of the plurality of first variable delay circuits 60 by the second delay amount setting section 48. Subsequently, the fourth adjustment processing section 50 inputs a clock signal into the plurality of phase comparators 70 by means of switching the second switch 74, and makes the plurality of phase comparators 70 determine a phase shift amount of each of the plurality of timing clock generating sections 62 (S16). Here, a change amount, by which the phase shift amount determined by each of the plurality of phase comparators 70 in the process of S16 is changed from the reference value, shows a delay amount by a path difference caused by switching the second switch to a path between the clock output terminal 120 and the corresponding phase comparator 70.

Next, the third delay amount setting section 52 sets a delay amount, by which a differential value between the phase shift amount determined by the fourth adjustment processing section 50 and the reference value substantially becomes zero, for each of the plurality of second variable delay circuits 68 (S17). In other words, the third delay amount setting section 52 sets a delay amount by which a phase shift amount becomes zero for each of the plurality of second variable delay circuits 68, when performing a process of step S16 in the state that the timing clock has been previously delayed by the second variable delay circuit 68 and been input into the phase comparator 70. As a result, each of the plurality of second variable delay circuits 68 can further input a timing clock, which is delayed by the delay amount on the path between the corresponding clock output terminal 120 and the corresponding phase comparator 70, into the phase comparator 70. According to this, the timing clock generating section 62 can output a timing clock delayed by a delay amount obtained by subtracting the delay amount on the path between the corresponding clock output terminal 120 and the corresponding phase comparator 70 from the delay amount on the path between the corresponding data terminal 110 and the corresponding timing comparator 66. By performing processes of steps S16 and S17, the test apparatus 10 adjusts the timing so that the plurality of data signals simultaneously output from the plurality of data terminals 110 of the device under test 100 can be concurrently acquired according to the timing of clock signal output from the clock output terminal 120 of the device under test 100.

Therefore, each of the plurality of timing comparators 66 can acquire the data signal output from the corresponding data terminal 110 at the timing based on the clock signal output from the clock output terminal 120 at the same time as this data signal. Then, the test apparatus 10 can concurrently acquire and test the plurality of data signals simultaneously output from the plurality of data terminals 110 at the timing based on the clock signal output from the clock output terminal 120.

In addition, when the device under test 100 is a device having a memory, the test signal supplying section 28 may write data for adjustment into the device under test 100 in advance of the adjustment by the third adjustment processing section 46. Then, the third adjustment processing section 46 may read data for adjustment from the device under test 100, input the plurality of data signals included in the read data for adjustment into the plurality of phase comparators 70, and make the plurality of phase comparators 70 determine a phase shift amount of each of the plurality of timing clock generating sections 62. According to this, although the device under test 100 is, e.g., a memory device, the test signal supplying section 28 can make the device under test 100 output a data signal by which the timing clock generating section 62 can generate a timing clock.

Figure 5:
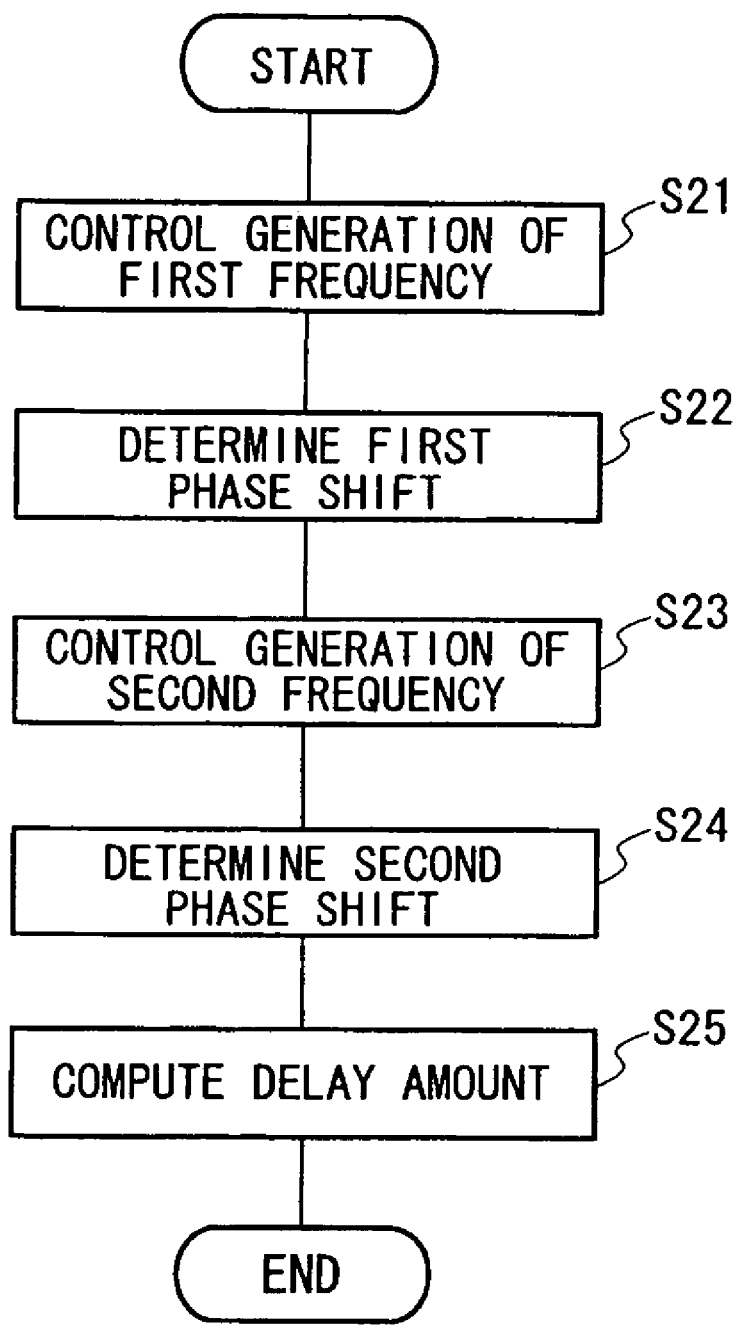
FIG. 5 is a view exemplary showing processing procedures in steps S12 and S14 shown in FIG. 4.

FIG. 5 is a view exemplary showing processing procedures in steps S12 and S14 shown in FIG. 4. The second adjustment processing section 42 may perform processes of the subsequent steps S21 to S25 to compute a delay amount when a path between the data input port of the test apparatus 10 and the corresponding timing comparator 66 has a delay amount not less than a period of the reference clock.

First, the second adjustment processing section 42 generates a reference clock with a first frequency from the reference clock source 22 (S21). Next, the second adjustment processing section 42 inputs, in place of a clock signal, a test signal output from the corresponding comparing section 24 into the corresponding phase comparator 70 in the state that the reference clock with the first frequency has been generated from the reference clock source 22. Then, the second adjustment processing section 42 makes the phase comparator 70 determine a phase shift amount of the timing clock generating section 62 at the reference clock with the first frequency (S22). According to this, the second adjustment processing section 42 can acquire the phase shift amount at the reference clock with the first frequency.

Next, the second adjustment processing section 42 generates a reference clock with a second frequency different from the first frequency from the reference clock source 22 (S23). Next, the second adjustment processing section 42 inputs, in place of a clock signal, a test signal output from the corresponding comparing section 24 into the corresponding phase comparator 70 in the state that the reference clock with the second frequency has been generated from the reference clock source 22. Then, the second adjustment processing section 42 makes the phase comparator 70 determine a phase shift amount of the timing clock generating section 62 at the reference clock with the second frequency (S24). According to this, the second adjustment processing section 42 can acquire the phase shift amount at the reference clock with the second frequency.

Next, the second adjustment processing section 42 computes a delay amount by which a first differential value and a second differential value substantially become zero for the corresponding timing comparator 66, based on the first differential value between the phase shift amount at the reference clock with the first frequency and the reference value and the second differential value between the phase shift amount at the reference clock with the second frequency and the reference value (S25). Then, the second adjustment processing section 42 uses the computed delay amount as a delay amount on a path between the data input port to the corresponding timing comparator 66.

By means of the above processes, the second adjustment processing section 42 can compute a path delay having a delay amount not less than a period of a reference clock. In addition, the third adjustment processing section 46 may also perform the processes of steps S21 to S25 to compute a delay amount when a delay amount on a path between the data terminal 110 and the corresponding data input port of the test apparatus 10 has a delay amount not less than the period of the reference clock.

Figure 6:
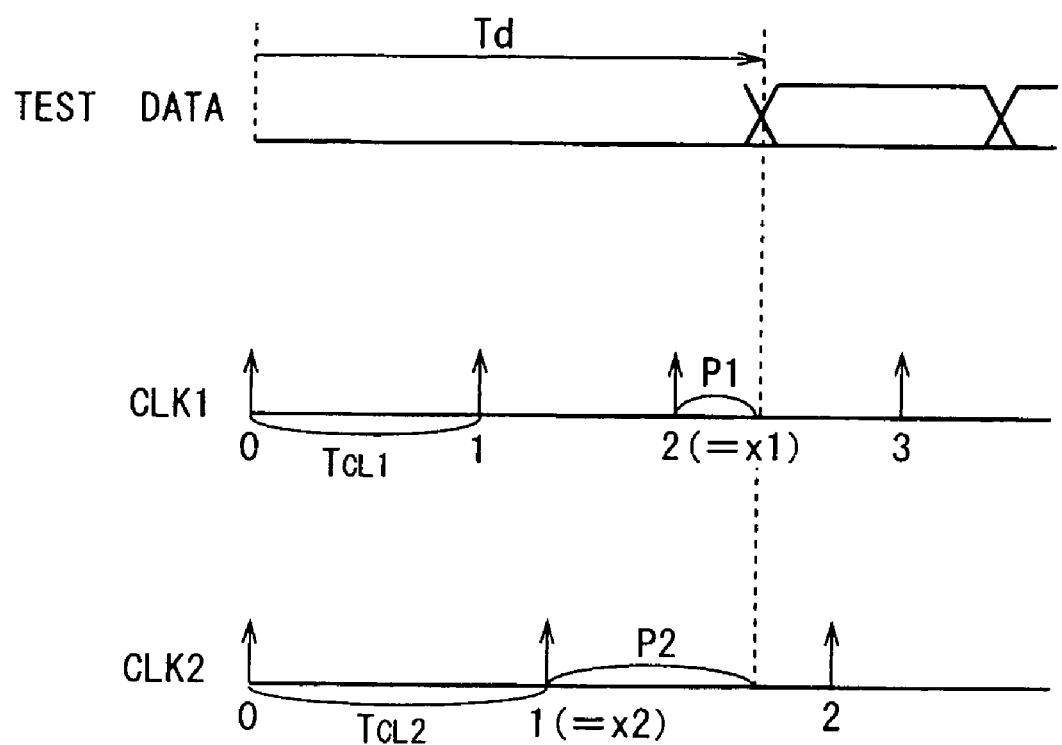
FIG. 6 is a view showing a test signal (TEST DATA), a reference clock (CLK1) with a first frequency, and a reference clock (CLK2) with a second frequency used in a process shown in FIG. 5.

FIG. 6 is a view showing the test signal (TEST DATA), the reference clock (CLK1) with the first frequency, and the reference clock (CLK2) with the second frequency used in a process shown in FIG. 5. In FIG. 6, the CLK1 shows the reference clock with the first frequency, the CLK2 shows the reference clock with the second frequency lower than the first frequency, and the TEST DATA shows the test signal synchronized with the first reference clock or the second reference clock output from the test signal supplying section 28. Moreover, in FIG. 6, Td shows the delay amount on the path between the data input port of the test apparatus 10 and the corresponding timing comparator 66 or the path between the data terminal 110 and the corresponding data input port, x1 shows the quotient obtained by dividing Td by a period ($T_{CL}1$) of the reference clock with the first frequency, P1 shows the remainder obtained by dividing Td by $T_{CL}1$, x2 shows the quotient obtained by dividing Td by a period ($T_{CL}2$) of the reference clock with the second frequency, and P2 shows the remainder obtained by dividing Td by $T_{CL}2$.

Here, Td is expressed by the following equation (1) or (2).

$$Td = (T_{CL}1 * x1) + P1 \qquad (1)$$

$$T_d = (T_{CL}2 * x2) + P2 \qquad (2)$$

The second adjustment processing section 42 (or the third adjustment processing section 46) previously sets the reference clock (CLK1) with the first frequency and the reference clock (CLK2) with the second frequency on condition that x1=x2 or x1=x1−1. Furthermore, the second adjustment processing section 42 (or the third adjustment processing section 46) previously sets the reference clock (CLK1) with the first frequency and the reference clock (CLK2) with the second frequency on condition that ($T_{CL}2 > T_{CL}1$) or ($T_{CL}2*(x1-1) < T_{CL}1*x1$). In addition, Td is determined under design to some extent. Therefore, the second adjustment processing section 42 (or the third adjustment processing section 46) may call, from a memory, the reference clock (CLK1) with the first frequency and the reference clock (CLK2) with the second frequency satisfying the previously computed two conditions. Moreover, the second adjustment processing section 42 (or the third adjustment processing section 46) may call Td determined under design from the memory to compute the reference clock (CLK1) with the first frequency and the reference clock (CLK2) with the second frequency satisfying the two conditions.

In case of P1≦P2, x2 is expressed as shown in the following equation (3).

$$x2 = x1 - 1 \qquad (3)$$

In case of P1≦P2, x1 is expressed as shown in the following equation (4) based on the equations (1), (2), and (3).

$$x1 = (P2 - P1 - T_{CL}2)/(T_{CL}1 - T_{CL}2) \qquad (4)$$

In case of P1>P2, x2 is expressed as shown in the following equation (5).

$$x2 = x1 \qquad (5)$$

In case of P1>P2, x1 is expressed as shown in the following equation (6) based on the equations (1), (2), and (5).

$$x1 = (P2 - P1)/(T_{CL}1 - T_{CL}2) \qquad (6)$$

Here, P1 corresponds to a first differential value between a phase shift amount and a reference value at the reference clock with the first frequency determined by the phase comparator 70. Moreover, P2 corresponds to a second differential value between a phase shift amount and a reference value at the reference clock with the second frequency determined by the phase comparator 70. Therefore, the second adjustment processing section 42 (or the third adjustment processing section 46) computes x1 based on the equation (4) in case of P1≦P2, and computes Td by adding the computed x1 and P1 (the first differential value). The second adjustment processing section 42 (or the third adjustment processing section 46) computes x1 based on the equation (6) in case of P1>P2, and computes Td by adding the computed x1 and P1 (the first differential value). By means of the above operations, the second adjustment processing section 42 (or the third adjustment processing section 46) can compute a delay amount Td on a path having a delay amount not less than the period of the reference clock.

Figure 7:
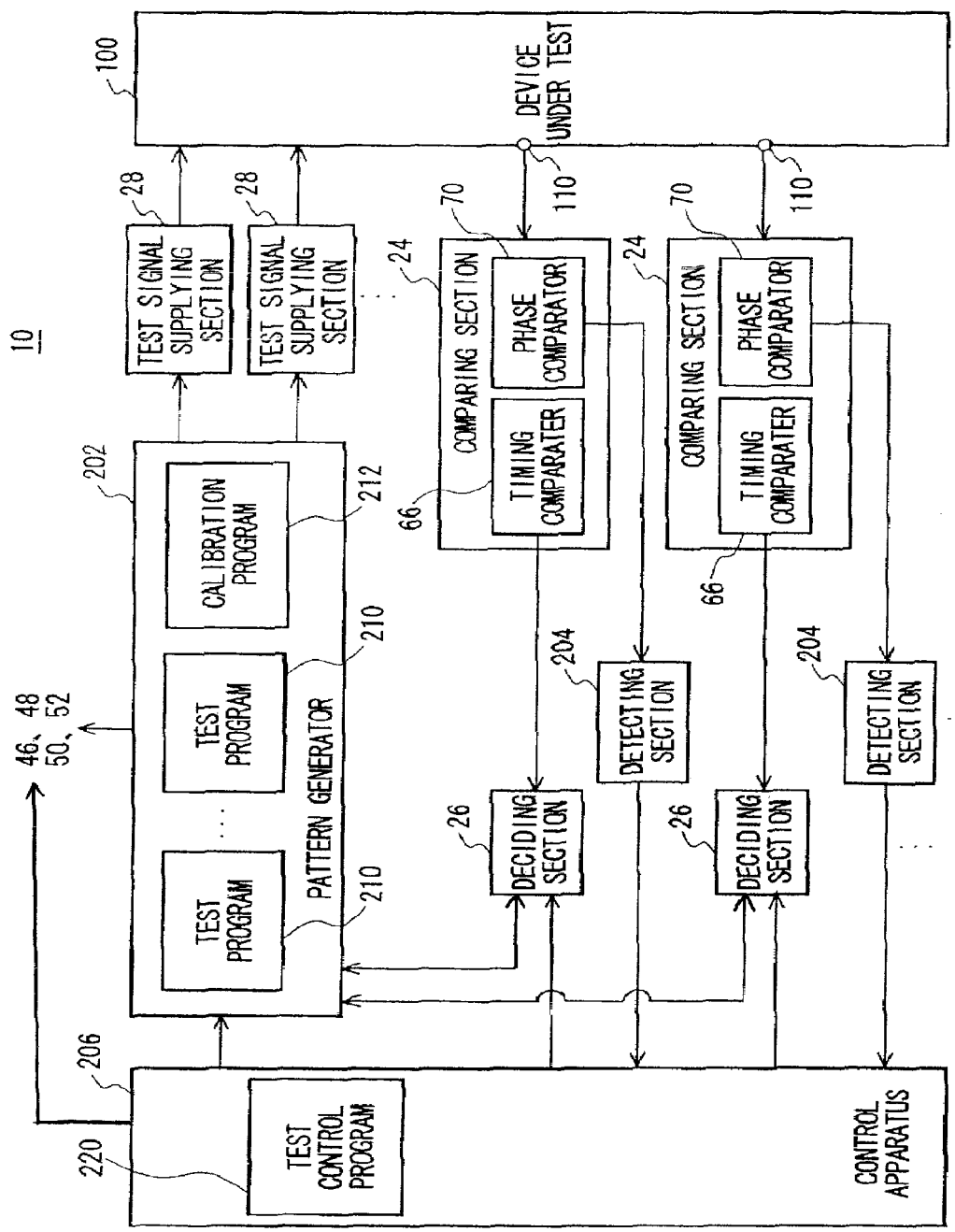
FIG. 7 is a view showing a configuration of a test apparatus 10 according to an alternative example along with a device under test 100.
Figure 8:
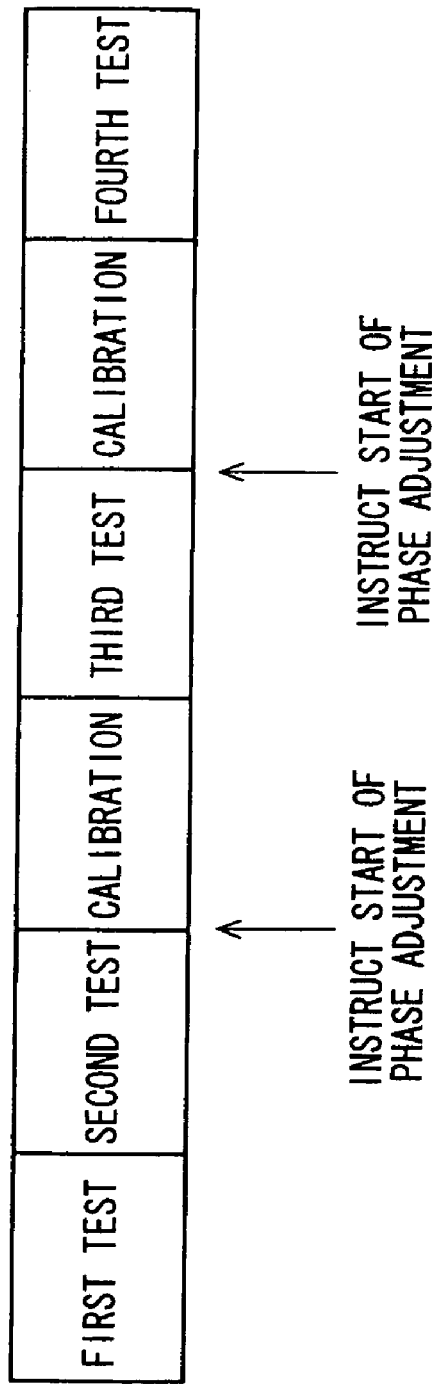
FIG. 8 is a view exemplary showing a test sequence by a test apparatus 10 according to an alternative example.

FIG. 7 is a view showing a configuration of the test apparatus 10 according to an alternative example along with the device under test 100. FIG. 8 is a view exemplary showing a test sequence by the test apparatus 10 according to an alternative example. In addition, since the test apparatus 10 shown in FIG. 7 has the substantially same configuration and function as those of the test apparatus 10 shown in FIG. 1, the substantially same components of FIG. 7 as those of FIG. 1 have the same reference numbers and the descriptions for them are omitted.

The test apparatus 10 further includes a pattern generator 202, a plurality of detecting sections 204, and a control apparatus 206. The pattern generator 202 executes a test sequence designated by a user, and supplies a test pattern associated with this test sequence to the plurality of test signal supplying sections 28. Each of the plurality of test signal supplying sections 28 outputs a test signal based on the test pattern supplied from the pattern generator 202 to the corresponding data terminal 110 of the device under test 100. Each of the plurality of test signal supplying sections 28 may generate, for example, a test signal rising and falling in accordance with a test pattern from the test pattern on which rising and falling edge type and timing are shown. Then, the pattern generator 202 causes at least one of a set of the third adjustment processing section 46 and the second delay amount setting section 48 and a set of the fourth adjustment processing section 50 and the third delay amount setting section 52 to start a phase adjustment (a calibration process), when the start of phase adjustment is indicated by an instruction in the test sequence during executing the test sequence. For example, as shown in FIG. 8, the pattern generator 202 may perform a calibration process when the start of phase adjustment is indicated between a test and a test.

As an example, the pattern generator 202 may have a plurality of test programs 210 and a calibration program 212. In this case, the pattern generator 202 executes a test sequence included in the designated test program 210, and supplies a test pattern associated with this test sequence to the plurality of test signal supplying sections 28. Then, in this case, when the start of phase adjustment is indicated by an instruction in the test sequence during executing the test sequence, the pattern generator 202 executes a calibration sequence included in the calibration program 212, and causes at least one of a set of the third adjustment processing section 46 and the second delay amount setting section 48 and a set of the fourth adjustment processing section 50 and the third delay amount setting section 52 to start phase adjustment. As an example, in regard to the pattern generator 202, a certain instruction may have a calibration start to start calibration and a calibration end to terminate calibration.

Furthermore, when the plurality of deciding sections 26 decides the good or bad of the plurality of data signals acquired by the plurality of timing comparators 66, the pattern generator 202 may prohibit a quality decision for the plurality of data signals by the plurality of deciding sections 26 while at least one of a set of the third adjustment processing section 46 and the second delay amount setting section 48 and a set of the fourth adjustment processing section 50 and the third delay amount setting section 52 performs phase adjustment. According to this, the test apparatus 10 can execute a calibration process between a test and a test.

Each of the detecting sections 204 are provided corresponding to the plurality of phase comparators 70, and detects whether the phase shift amount output from the corresponding phase comparator 70 becomes a value outside a predetermined acceptable limit during executing the test program. According to this, the detecting section 204 can detect whether the calibration should be started by environmental variation such as temperature change once more.

The control apparatus 206 executes the test control program 220 designated by the user, and makes the pattern generator 202 sequentially execute the plurality of test programs 210 described in the test control program 220. Furthermore, the control apparatus 206 causes the pattern generator 202 to execute the calibration program 212 and thus causes at least one of a set of the third adjustment processing section 46 and the second delay amount setting section 48 and a set of the fourth adjustment processing section 50 and the third delay amount setting section 52 to start phase adjustment, when a start command of phase adjustment is executed between the end of execution of the one test program 210 and the start of execution of the other test program 210 during executing the test control program 220. Moreover, the control apparatus 206 may cause a set of the fourth adjustment processing section 50 and the third delay amount setting section 52 to start phase adjustment, on condition that either of the detecting sections 204 has detected that the phase shift amount become a value outside an acceptable limit, when the command is executed during executing the test control program 220. As an example, the plurality of detecting sections 204 may include a register for storing a maximum value of a phase shift amount of the corresponding phase comparator 70 and detect whether the phase shift amount becomes a value outside an acceptable limit by monitoring a value of the register.

As described above, since the test apparatus 10 according to an alternative example can execute a calibration process at an arbitrary timing, a phase of an error caused with time and by an environment can be adjusted at an optimal timing. Moreover, the test apparatus 10 can perform phase adjustment with high precision because calibration is performed in test environment.

Figure 9:
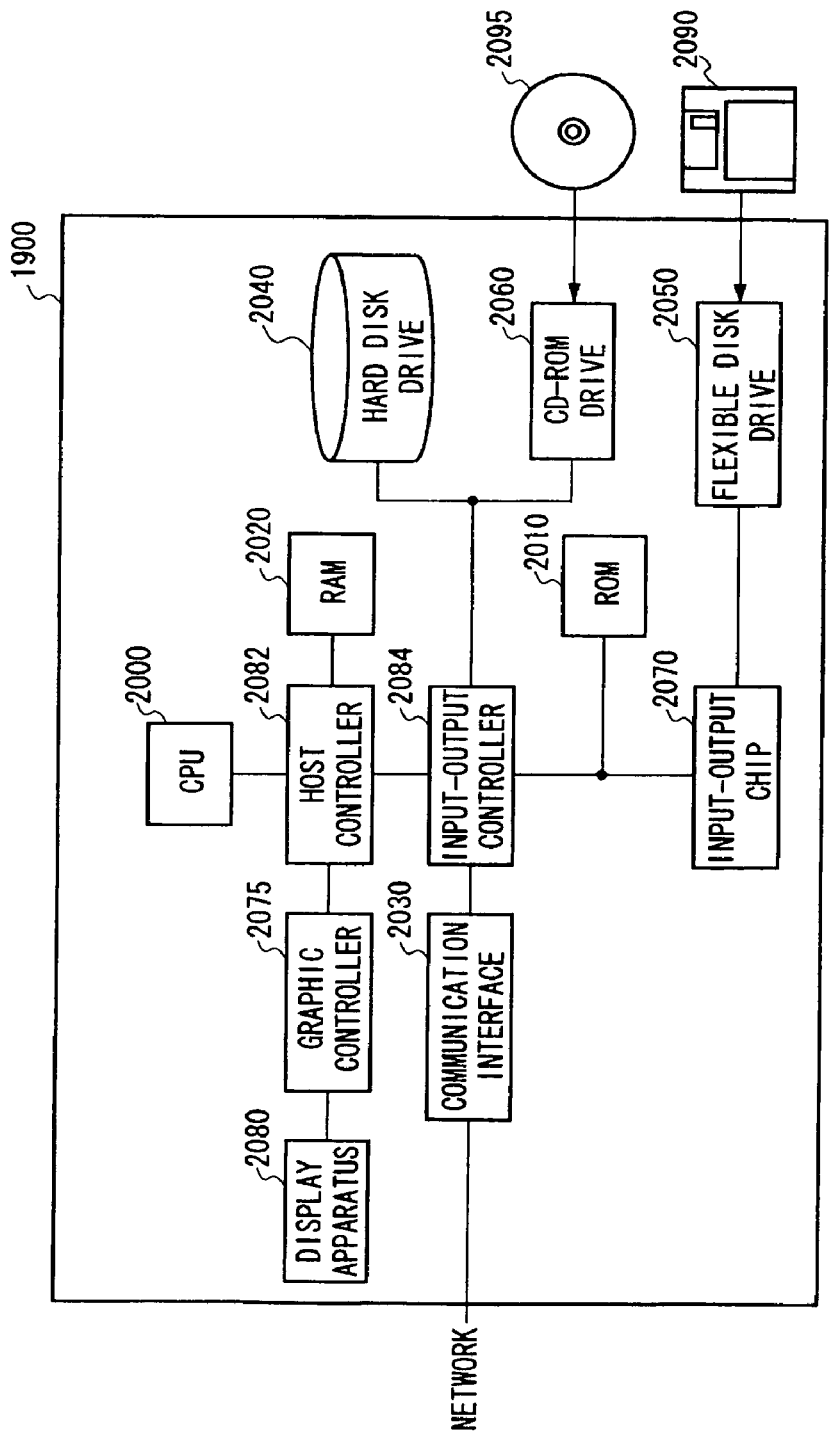
FIG. 9 is a view exemplary showing a hardware configuration of a computer 1900 according to an embodiment of the present invention.

FIG. 9 is a view exemplary showing a hardware configuration of a computer 1900 according to an embodiment of the present invention. The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010, the flexible disk drive 2050, and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses such as the flexible disk drive 2050 via a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed by the CPU 2000.

A program installed in the computer 1900 for making the computer 1900 as function as the control apparatus in the test apparatus 10 includes the first adjustment module and the second adjustment module. The first adjustment module has the first adjustment processing module, the second adjustment processing module, the first delay amount setting module, the third adjustment processing module, and the second delay amount setting module. The second adjustment module has the fourth adjustment processing module and the third delay amount setting module. These programs or modules work on the CPU 2000 or the like, and makes the computer 1900 respectively function as the first adjusting section 32 having the first adjustment processing section 40, the second adjustment processing section 42, the first delay amount setting section 44, the third adjustment processing section 46, and the second delay amount setting section 48, and the second adjusting section 34 having the fourth adjustment processing section 50 and the third delay amount setting section 52.

A program or modules described above may be stored on an outside storage medium. A storage medium can include an optical recording medium such as DVD or CD, a magneto-optical recording medium such as MO, a tape medium, a semiconductor memory such as an IC card, in addition to the flexible disk 2090 and the CD-ROM 2095. Moreover, a storage device such as a hard disk or a RAM provided in a server system connected to a private communication network or an Internet may be used as a recording medium, and the program may be provided to the computer 1900 via a network.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to realize a test apparatus, an adjustment method, and a recording medium for testing a device under test including a plurality of data terminals and a clock output terminal for outputting a clock signal showing the timing at which data signals output from the plurality of data terminals should be acquired with high precision.

What is claimed is:

1. A test apparatus that tests a device under test including a plurality of data terminals and a clock output terminal for outputting a clock signal showing the timing at which data signals output from the plurality of data terminals should be acquired, the test apparatus comprising:

a reference clock source that generates a reference clock for this test apparatus;

a plurality of first variable delay circuits that is provided corresponding to the plurality of data terminals and each of which delays the reference clock by a designated time;

a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount;

a timing comparator that is provided corresponding to the plurality of data terminals and each of which acquires a data signal output from the corresponding data terminal in accordance with the corresponding timing clock;

a plurality of second variable delay circuits that is provided corresponding to the plurality of data terminals and each of which delays the corresponding timing clock by a designated time;

a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference;

a first adjusting section that adjusts a delay amount of each of the plurality of first variable delay circuits so that the plurality of timing comparators acquires data signals simultaneously output from the plurality of data terminals based on the plurality of timing clocks output from the plurality of timing clock generating sections; and a second adjusting section that adjusts a delay amount of each of the plurality of second variable delay circuits, so that the plurality of timing comparators can acquire the data signals simultaneously output from the plurality of data terminals based on the clock signal output from the clock output terminal, in the state that the first adjusting section has adjusted the delay amount of each of the plurality of first variable delay circuits.

2. The test apparatus as claimed in claim 1, wherein the test apparatus further comprises a plurality of test signal supplying sections that is provided corresponding to the plurality of data terminals and each of which outputs a test signal to be supplied to the corresponding data terminal, and the first adjusting section includes:
   a first adjustment processing section that directs the plurality of test signals output from the plurality of test signal supplying sections, in place of the plurality of data signals output from the plurality of data terminals, into the plurality of timing comparators and adjusts an acquisition timing of each timing comparator so that the plurality of timing comparators can acquire the plurality of test signals simultaneously output from the plurality of test signal supplying sections based on the plurality of timing clocks, in a state that the phase shift amount for each of the plurality of timing clock generating sections has been set to a predetermined reference value;
   a second adjustment processing section that directs the plurality of test signals, in place of the clock signal, into the plurality of phase comparators and makes the plurality of phase comparators determine the phase shift amount for each of the plurality of timing clock generating sections; and
   a first delay amount setting section that sets, for each of the plurality of second variable delay circuits, a delay amount by which a differential value between the phase shift amount determined by the second adjustment processing section and the reference value substantially becomes zero.

3. The test apparatus as claimed in claim 2, wherein the first adjusting section further includes:
   a third adjustment processing section that makes the plurality of phase comparators receive the plurality of data signals output from the plurality of data terminals of the device under test in place of the clock signal and makes the plurality of phase comparators determine the phase shift amount of each of the plurality of timing clock generating sections, in the state that the first delay amount setting section has set a delay amount of the plurality of second variable delay circuits; and
   a second delay amount setting section that sets, for each of the plurality of first variable delay circuits, a delay amount by which a differential value between the phase shift amount determined by the third adjustment processing section and the reference value substantially becomes zero.

4. The test apparatus as claimed in claim 3, wherein the second adjusting section includes:
   a fourth adjustment processing section that makes the plurality of phase comparators receive the clock signal and makes the plurality of phase comparators determine the phase shift amount of each of the plurality of timing clock generating sections, in the state that the first delay amount setting section has set the delay amount of the plurality of second variable delay circuits and the second delay amount setting section has set the delay amount of the plurality of first variable delay circuits; and
   a third delay amount setting section that sets, for each of the plurality of second variable delay circuits, a delay amount by which a differential value between the phase shift amount determined by the fourth adjustment processing section and the reference value substantially becomes zero.

5. The test apparatus as claimed in claim 3, wherein the device under test is a device having a memory, the test signal supplying section writes data for adjustment into the memory in advance of the adjustment by the third adjustment processing section, and the third adjustment processing section reads the data for adjustment from the memory, directs the plurality of data signals included in the read data for adjustment into the plurality of phase comparators, and makes the plurality of phase comparators determine the phase shift amount of each of the plurality of timing clock generating sections.

6. The test apparatus as claimed in claim 4, wherein the test apparatus further comprises a pattern generator that executes a test sequence and supplies a test pattern associated with this test sequence to the plurality of test signal supplying sections,
   each of the plurality of test signal supplying sections outputs a test signal based on the test pattern supplied from the pattern generator to the corresponding data terminal of the device under test, and
   the pattern generator causes at least one of a set of the third adjustment processing section and the second delay amount setting section and a set of the fourth adjustment processing section and the third delay amount setting section to start phase adjustment, when the phase adjustment has been started by an instruction in the test sequence during executing the test sequence.

7. The test apparatus as claimed in claim 6, wherein the test apparatus further comprises a plurality of deciding sections that compares each of the plurality of data signals acquired by the plurality of timing comparators with an expected value to decide the good or bad of each data signal, and
   the pattern generator prohibits a quality decision for the plurality of data signals performed by the plurality of deciding sections while at least one of a set of the third adjustment processing section and the second delay amount setting section and a set of the fourth adjustment processing section and the third delay amount setting section performs the phase adjustment.

8. The test apparatus as claimed in claim 4, wherein the test apparatus further comprises:
   a pattern generator that executes a test sequence included in a designated test program and supplies a test pattern associated with this test sequence to the plurality of test signal supplying sections; and
   a control apparatus that executes a test control program designated by a user and makes the pattern generator sequentially execute a plurality of test programs described in the test control program, each of the plurality of test signal supplying sections outputs a test signal based on the test pattern supplied from the pattern generator to the corresponding data terminal of the device under test, and the control apparatus causes at least one of a set of the third adjustment processing section and the second delay amount setting section and a set of the fourth adjustment processing section and the third delay amount setting section to start phase adjustment, when a start command of phase adjustment is executed between the end of execution of the one test program and the start of execution of the other test program during executing the test control program.

9. The test apparatus as claimed in claim 8, wherein
the test apparatus further comprises a plurality of detecting sections that is provided corresponding to the plurality of phase comparators and detects whether the phase shift amount output from the corresponding phase comparator during executing the test program becomes a value outside a predetermined acceptable limit, and the control apparatus causes a set of the fourth adjustment processing section and the third delay amount setting section to start phase adjustment, on condition that either of the detecting sections has detected that the phase shift amount become a value outside an acceptable limit, when the command is executed during executing the test control program.

10. An adjustment method for adjusting a test apparatus that tests a device under test including a plurality of data terminals and a clock output terminal for outputting a clock signal showing the timing at which data signals output from the plurality of data terminals should be acquired, the test apparatus comprising:
a reference clock source that generates a reference clock for this test apparatus;
a plurality of first variable delay circuits that is provided corresponding to the plurality of data terminals and each of which delays the reference clock by a designated time;
a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount;
a timing comparator that is provided corresponding to the plurality of data terminals and each of which acquires a data signal output from the corresponding data terminal in accordance with the corresponding timing clock;
a plurality of second variable delay circuits that is provided corresponding to the plurality of data terminals and each of which delays the corresponding timing clock by a designated time; and
a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference, and the adjustment method comprising:
a first adjusting step of adjusting a delay amount of each of the plurality of first variable delay circuits so that the plurality of timing comparators acquires data signals simultaneously output from the plurality of data terminals based on the plurality of timing clocks output from the plurality of timing clock generating sections; and
a second adjusting step of adjusting a delay amount of each of the plurality of second variable delay circuits, so that the plurality of timing comparators can acquire the data signals simultaneously output from the plurality of data terminals based on the clock signal output from the clock output terminal, in the state that the delay amount of each of the plurality of first variable delay circuits has been adjusted in the first adjusting step.

11. A recording medium for recording an adjustment program being executed in a test apparatus that tests a device under test including a plurality of data terminals and a clock output terminal for outputting a clock signal showing the timing at which data signals output from the plurality of data terminals should be acquired, the test apparatus comprising:
a reference clock source that generates a reference clock for this test apparatus;
a plurality of first variable delay circuits that is provided corresponding to the plurality of data terminals and each of which delays the reference clock by a designated time;
a plurality of timing clock generating sections that is provided corresponding to the plurality of data terminals and each of which outputs a timing clock having a phase obtained by shifting a phase of the reference clock delayed by the corresponding first variable delay circuit by a designated phase shift amount;
a timing comparator that is provided corresponding to the plurality of data terminals and each of which acquires a data signal output from the corresponding data terminal in accordance with the corresponding timing clock;
a plurality of second variable delay circuits that is provided corresponding to the plurality of data terminals and each of which delays the corresponding timing clock by a designated time; and
a plurality of phase comparators that is provided corresponding to the plurality of data terminals and each of which detects a phase difference between the clock signal output from the clock output terminal and the timing clock delayed by the corresponding second variable delay circuit in order to output the phase shift amount according to this phase difference, and the adjustment program making the test apparatus function as:
a first adjusting section that adjusts a delay amount of each of the plurality of first variable delay circuits so that the plurality of timing comparators acquires data signals simultaneously output from the plurality of data terminals based on the plurality of timing clocks output from the plurality of timing clock generating sections; and
a second adjusting section that adjusts a delay amount of each of the plurality of second variable delay circuits, so that the plurality of timing comparators can acquire the data signals simultaneously output from the plurality of data terminals based on the clock signal output from the clock output terminal, in the state that the first adjusting section has adjusted the delay amount of each of the plurality of first variable delay circuits.

* * * * *